United States Patent
Wu et al.

(10) Patent No.: US 11,200,860 B2
(45) Date of Patent: Dec. 14, 2021

(54) SHIFT REGISTER UNIT, GATE DRIVING CIRCUIT AND DRIVING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Wu, Beijing (CN); Jia Chen, Beijing (CN); Wen Tan, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 16/703,466

(22) Filed: Dec. 4, 2019

(65) Prior Publication Data
US 2020/0111435 A1  Apr. 9, 2020

Related U.S. Application Data (62) Division of application No. 15/507,580, filed as application No. PCT/CN2016/093242 on Aug. 4, 2016, now Pat. No. 10,657,916.

(30) Foreign Application Priority Data

Nov. 5, 2015  (CN) .......................... 201510745607.7

(51) Int. Cl.
*G11C 19/00* (2006.01)
*G09G 3/36* (2006.01)
(Continued)

(52) U.S. Cl.
CPC ............. *G09G 3/3674* (2013.01); *G09G 3/20* (2013.01); *G09G 3/3266* (2013.01); *G11C 19/18* (2013.01);
(Continued)

(58) Field of Classification Search
None
See application file for complete search history.

(56) References Cited

U.S. PATENT DOCUMENTS 4,799,040 A  1/1989 Yanagi
6,630,920 B1  10/2003 Mackawa et al.
(Continued)

FOREIGN PATENT DOCUMENTS

CN  202196566 U  4/2012
CN  103345911 A  10/2013
(Continued)

OTHER PUBLICATIONS

USPTO NOA dated Jan. 23, 2020 in connection with U.S. Appl. No. 15/507,580.
(Continued)

*Primary Examiner* — Tuan T Lam (57) ABSTRACT

The embodiments of the present disclosure provide a shift register unit, a gate driving circuit and a driving method thereof, and a display device. The shift register unit, includes two transfer gate modules (211, 212), two NOR gate modules (NOR1, NOR2), two AND gate modules (AND3, AND4), two capacitor modules (241, 241), and two inverter modules (225, 227). The shift register unit provided in the present disclosure can make the layout area occupied by the corresponding gate driving circuit reduce greatly as compared with that occupied by the gate driving circuit in the prior art, which facilitates border narrowing of the corresponding display device.

8 Claims, 7 Drawing Sheets

(51) Int. Cl.
*G11C 19/28* (2006.01)
*G11C 19/18* (2006.01)
*G09G 3/20* (2006.01)
*G09G 3/3266* (2016.01)

(52) U.S. Cl.
CPC ............ *G11C 19/184* (2013.01); *G11C 19/28* (2013.01); *G09G 3/3677* (2013.01); *G09G 2310/0286* (2013.01); *G09G 2310/0291* (2013.01); *G09G 2310/08* (2013.01)

(56) References Cited

U.S. PATENT DOCUMENTS

| | | |
|---|---|---|
| 9,559,671 B1 | 1/2017 | Jagannathan et al. |
| 2003/0063079 A1 | 4/2003 | Abe et al. |
| 2004/0066361 A1 | 4/2004 | Ishii et al. |
| 2005/0259778 A1 | 11/2005 | Kimura |
| 2010/0272228 A1 | 10/2010 | Hsiao et al. |
| 2013/0141157 A1 | 6/2013 | Takemura |
| 2015/0243237 A1 | 8/2015 | Li et al. |
| 2015/0248867 A1* | 9/2015 | Tan ........................ G11C 19/28 345/100 |

FOREIGN PATENT DOCUMENTS

| | | |
|---|---|---|
| CN | 104599622 A | 5/2015 |
| CN | 105225625 A | 1/2016 |

OTHER PUBLICATIONS

International Search Report and Written Opinion dated Nov. 10, 2016; PCT/CN2016/093242.

USPTO RR dated Aug. 7, 2018 in connection with U.S. Appl. No. 15/507,580.

USPTO NFOA dated Nov. 20, 2018 in connection with U.S. Appl. No. 15/507,580.

USPTO FOA dated Mar. 13, 2019 in connection with U.S. Appl. No. 15/507,580.

USPTO NFOA dated Sep. 11, 2019 in connection with U.S. Appl. No. 15/507,580.

\* cited by examiner

SHIFT REGISTER UNIT, GATE DRIVING CIRCUIT AND DRIVING METHOD THEREOF

The present application is a divisional application for the same invention claimed in the prior non-provisional application Ser. No. 15/507,580, titled of "SHIFT REGISTER UNIT, GATE DRIVING CIRCUIT AND DRIVING METHOD THEREOF, AND DISPLAY DEVICE."

TECHNICAL FIELD

The present disclosure relates to a shift register unit, a gate driving circuit and a driving method thereof, and a display device.

BACKGROUND

With the continuous development of display technology, high resolution and narrow border has become a trend of development of display devices, and application of GOA (Gate Driver IC on Array) in display devices is one of the important methods to achieve narrow border and high resolution.

The GOA in the prior art typically includes multiple cascaded shift register units. Such structure results in that a gate driving circuit has a relatively large layout area, which is inimical to border narrowing of display devices.

SUMMARY

In order to reduce the layout area of the gate driving circuit, the present disclosure provides a shift register unit, a gate driving circuit and a driving method thereof, and a display device.

In a first aspect, an embodiment of the present disclosure provides a shift register unit, comprising two transfer gate modules, four AND gate modules, and two capacitor modules, as well as a pulse signal input terminal, four pulse signal output terminals, and a plurality of clock signal input terminals;

a first terminal of a first capacitor module is connected to a first node; a first terminal of a second capacitor module is connected to a third node;

a first input terminal of a first transfer gate module is connected to the pulse signal input terminal, a second input terminal of the first transfer gate module is connected to a first clock signal input terminal, a third input terminal of the first transfer gate module is connected to a second clock signal input terminal, and an output terminal of the first transfer gate module is connected to the first node; a first input terminal of a second transfer gate module is connected to a second node, a second input terminal of the second transfer gate module is connected to a third clock signal input terminal, a third input terminal of the second transfer gate module is connected to a fourth clock signal input terminal, and an output terminal of the second transfer gate module is connected to the third node;

each transfer gate module is configured to be turned on when a first level is inputted to the second input terminal thereof and the third input terminal thereof is at a second level, so as to write a scan signal inputted to the first input terminal thereof to a node connected to the output terminal thereof; a level of the scan signal is the first level, the second level being opposite to the first level;

a first input terminal of a first AND gate module is connected to a fifth clock signal input terminal, a second input terminal of the first AND gate module is connected to the second node, and an output terminal of the first AND gate module is connected to a first pulse signal output terminal; a first input terminal of a second AND gate module is connected to a sixth clock signal input terminal, a second input terminal of the second AND gate module is connected to the second node, and an output terminal of the second AND gate module is connected to a second pulse signal output terminal; a first input terminal of a third AND gate module is connected to a seventh clock signal input terminal, a second input terminal of the third AND gate module is connected to a fourth node, and an output terminal of the third AND gate module is connected to a third pulse signal output terminal; a first input terminal of the fourth AND gate module is connected to an eighth clock signal input terminal, a second input terminal of the fourth AND gate module is connected to the fourth node, and an output terminal of the fourth AND gate module is connected to a fourth pulse signal output terminal;

each AND gate module is configured to output a first level through an output terminal thereof when both the first input terminal thereof and the second input terminal thereof are at a first level; and the second node is electrically connected to the first node, a level state of the second node is in synchronization with a level state of the first node; the fourth node is electrically connected to the third node, a level state of the fourth node is in synchronization with a level state of the third node.

Further, the shift register unit further comprises a first buffer-amplifier module and/or a second buffer-amplifier module;

an input terminal of the first buffer-amplifier module is connected to the first node, an output terminal of the first buffer-amplifier module is connected to the second node; an input terminal of the second buffer-amplifier module is connected to the third node, an output terminal of the second buffer-amplifier module is connected to the fourth node; and each buffer-amplifier module is configured to amplify a pulse signal inputted to the input terminal thereof and output it through the output terminal thereof.

Further, each buffer-amplifier module comprises an even number of inverter circuits cascaded to each other, an input terminal of the inverter circuit in a first stage is the input terminal of the buffer-amplifier module, and an output terminal of the inverter circuit in a last stage is the output terminal of the buffer-amplifier module.

Further, the shift register unit further comprises a ground voltage terminal, a second terminal of each capacitor module being connected to the ground voltage terminal.

Further, each AND gate module comprises one NAND gate circuit and one inverter circuit, one input terminal of the NAND gate circuit is a first input terminal of the AND gate module, another input terminal of the NAND gate circuit is a second input terminal of the AND gate module, and an output terminal of the NAND gate circuit is connected to an input terminal of the inverter circuit; and an output terminal of the inverter circuit is the output terminal of the AND gate module; and the NAND gate circuit is configured to output a second level through the output terminal when two input terminals thereof are both at a first level.

Further, the first clock signal input terminal and the fourth clock signal input terminal are the same clock signal input terminal; and/or, the second clock signal input terminal and the third clock signal input terminal are the same clock signal input terminal.

Further, the first level is a high level, and the second level is a low level.

In a second aspect, an embodiment of the present disclosure further provides a gate driving circuit, comprising: a plurality of shift register units and a plurality of clock signal lines; each shift register unit being any of shift register unit described above;

the fourth node of the shift register unit in each stage except the last stage is connected to the pulse signal input terminal of the shift register unit in a next stage, and the pulse signal input terminal of the shift register unit in each stage except the first stage is connected to the fourth node of the shift register unit in a previous stage; within the shift register unit in each stage, each clock signal Input terminal is connected to one clock signal line.

Further, the gate driving circuit further comprises a first OR gate unit and/or a second OR gate unit;

one input terminal of the first OR gate unit is connected to a clock signal line connected to the fifth clock signal input terminal in each shift register unit, the other input terminal of the first OR gate unit is connected to a clock signal line connected to the sixth clock signal input terminal in each shift register unit, and an output terminal of the first OR gate unit is connected to a clock signal line connected to the first clock signal input terminal in each shift register unit;

one input terminal of the second OR gate unit is connected to a clock signal line connected to the seventh clock signal input terminal in each shift register unit, the other input terminal of the second OR gate unit is connected to a clock signal line connected to the eighth clock signal input terminal in each shift register unit, and an output terminal of the second OR gate unit is connected to a clock signal line connected to the third clock signal input terminal in each shift register unit; and each OR gate unit is configured to output a first level through the output terminal thereof when either one of the two input terminals thereof is inputted with a first level.

Further, each OR gate unit comprises one NOR gate circuit and one inverter circuit; one input terminal of the NOR gate circuit is one input terminal of the OR gate unit, the other input terminal of the NOR gate circuit is the other input terminal of the OR gate unit, and an output terminal of the NOR gate circuit is connected to an input terminal of the inverter circuit; and an output terminal of the inverter circuit is the output terminal of the OR gate unit.

In a third aspect, an embodiment of the present disclosure provides a method of driving any of gate driving circuit described above, the method comprising:

inputting a start pulse signal to the pulse signal input terminal of the shift register unit in a first stage, and applying corresponding clock signals to the respective clock signal input terminals of the shift register unit in each stage through the respective clock signal lines;

wherein widths of first level pulses in the clock signals applied to the first clock signal input terminal, the second clock signal input terminal, the third clock signal input terminal, and the fourth clock signal input terminal of the respective shift register units, all are a half of a width of the start pulse signal, and their duty cycles all are ½; and the clock signal applied to the first clock signal input terminal and the clock signal applied to the fourth clock signal input terminal are in synchronization, and the clock signal applied to the second clock signal input terminal and the clock signal applied to the third clock signal input terminal are in synchronization;

a level of the start pulse signal is a first level, a start time of the start pulse signal coincides with a start time of one first level pulse in the clock signals applied to the second clock signal input terminal and the third clock signal input terminal; and first level pulses in the clock signals applied to the fifth clock signal input terminal, the sixth clock signal input terminal, the seventh clock signal input terminal, and the eighth clock signal input terminal of the respective shift register units, are arranged head-to-end in sequence, their widths all are a quarter of a width of the start pulse signal; a start time of the first level pulse in the clock signal applied to the fifth clock signal input terminal coincides with a start time of one first level pulse in the clock signals applied to the first clock signal input terminal and the second clock signal input terminal In a fourth aspect, an embodiment of the present disclosure further provides a shift register unit, comprising two transfer gate modules, two NOR gate modules, two AND gate modules, two capacitor modules, and two inverter modules;

a first terminal of a first capacitor module is connected to a first node; a first terminal of a second capacitor module is connected to a third node;

a first input terminal of a first transfer gate module is connected to the pulse signal input terminal, a second input terminal of the first transfer gate module is connected to a first clock signal input terminal, a third input terminal of the first transfer gate module is connected to a second clock signal input terminal, and an output terminal of the first transfer gate module is connected to the first node; a first input terminal of a second transfer gate module is connected to a second node, a second input terminal of the second transfer gate module is connected to a third clock signal input terminal, a third input terminal of the second transfer gate module is connected to a fourth clock signal input terminal, and an output terminal of the second transfer gate module is connected to the third node;

each transfer gate module is configured to be turned on when a first level is inputted to the second input terminal thereof and the third input terminal thereof is at a second level, so as to write a scan signal inputted to the first input terminal thereof to a node connected to the output terminal thereof; a level of the scan signal is the first level, the second level being opposite to the first level;

a first input terminal of a first NOR gate module is connected to a fifth clock signal input terminal, a second input terminal of the first NOR gate module is connected to the second node, and an output terminal of the first NOR gate module is connected to a first pulse signal output terminal; a first input terminal of a second NOR gate module is connected a sixth clock signal input terminal, a second input terminal of the second NOR gate module is connected to the second node, and an output terminal of the second NOR gate module is connected to a second pulse signal output terminal; and each NOR gate module is configured to output a first level through the output terminal thereof when both the first input terminal thereof and the second input terminal thereof are at a second level; the second level being opposite to the first level;

a first input terminal of a first AND gate module is connected to a seventh clock signal input terminal, a second input terminal of the first AND gate module is connected to a fourth node, and an output terminal of the first AND gate module is connected to a third pulse signal output terminal; a first input terminal of the second AND gate module is connected to an eighth clock signal input terminal, a second input terminal of the second AND gate module is connected to the fourth node, and an output terminal of the second AND gate module is connected to a fourth pulse signal output terminal;

each AND gate module is configured to output a first level through the output terminal thereof when both the first input terminal thereof and the second input terminal thereof are at a first level;

an input terminal of a first inverter module is connected to the first node, an output terminal of the first inverter is connected to the second node; an input terminal of a second inverter module is connected to the third node, and an output terminal of the second inverter module is connected to the fourth node; and each inverter module is configured to phase-invert a level signal inputted to the input terminal thereof and output it through the output terminal thereof.

Further, each inverter module is configured to phase-invert and buffer-amplify a level signal inputted to the input terminal thereof and output it through the output terminal thereof.

Further, each inverter module comprises an odd number of inverter circuits;

when the number of the inverter circuits is one, an input terminal of the inverter circuit is the input terminal of the inverter module, and an output terminal of the inverter circuit is the output terminal of the inverter module; and when the number of the inverter circuits is an odd-number not equal to one, the respective inverter circuits are cascaded to each other, an input terminal of the inverter circuit in a first stage is the input terminal of the inverter module, and an output terminal of the inverter circuit in a last stage is the output terminal of the inverter module.

Further, each NOR gate module comprises one OR circuit and one inverter circuit, one input terminal of the OR gate circuit is a first input terminal of the NOR gate circuit, the other input terminal of the OR gate circuit is a second input terminal of the input terminal of the NOR gate circuit, an output terminal of the OR gate circuit is connected to the input terminal of the inverter circuit; the output terminal of the inverter circuit is the output terminal of the NOR gate circuit; and the OR gate circuit is configured to output a first level through the output terminal thereof when a first level is inputted to either one of the two input terminals.

Further, the shift register unit further comprises a ground voltage terminal, a second terminal of each capacitor module being connected to the ground voltage terminal.

Further, the first clock signal input terminal and the fourth clock signal input terminal are the same clock signal input terminal; and/or, the second clock signal input terminal and the third clock signal input terminal are the same clock signal input terminal.

Further, the first level is a high level, and the second level is a low level.

In a fifth aspect, an embodiment of the present disclosure further provides a gate driving circuit, comprising: a plurality of shift register units and a plurality of clock signal lines; each shift register unit being any of shift register unit described above;

the fourth node of the shift register unit in each stage except the last stage is connected to the pulse signal input terminal of the shift register unit in a next stage, and the pulse signal input terminal of the shift register unit in each stage except the first stage is connected to the fourth node of the shift register unit in a previous stage; within the shift register unit in each stage, each clock signal input terminal is connected to one clock signal line.

Further, the gate driving circuit further comprises a first OR gate unit and two inverter units;

an input terminal of a first inverter unit is connected to one input terminal of the first OR gate unit, and an output terminal of the first inverter unit is connected to the clock signal line connected to the fifth clock signal input terminal of each shift register unit; an input terminal of a second inverter unit is connected to the other input terminal of the first OR gate unit, and an output terminal of the second inverter unit is connected to the clock signal line connected to the sixth clock signal input terminal of each shift register unit; an output terminal of the first OR gate unit is connected to a clock signal line connected to the first clock signal input terminal of each shift register unit;

and/or, the gate driving circuit further comprises a second OR gate unit;

one input terminal of the second OR gate unit is connected to the clock signal line connected to the seventh clock signal input terminal of each shift register unit, the other input terminal of the second OR gate unit is connected to the clock signal line connected to the eighth clock signal input terminal of each shift register unit, and an output terminal of the second OR gate unit is connected to the clock signal line connected to the third clock signal input terminal of each shift register unit;

wherein each inverter unit is configured to phase-invert a signal inputted to the input terminal thereof and output it through the output terminal thereof; each OR gate unit is configured to output a first level through the output terminal thereof when either one of the two input terminals thereof is inputted with a first level.

Further, each OR gate unit comprises one NOR gate circuit and one inverter circuit;

one input terminal of the NOR gate circuit is one input terminal of the OR gate unit, the other input terminal of the NOR gate circuit is the other input terminal of the OR gate unit, and an output terminal of the NOR gate circuit is connected to an input terminal of the inverter circuit; and an output terminal of the inverter circuit is the output terminal of the OR gate unit.

In a sixth aspect, an embodiment of the present disclosure further provides a method of driving any of the gate driving circuit described above, the method comprising:

inputting a start pulse signal to the pulse signal input terminal of the shift register unit in a first stage, and applying corresponding clock signals to the respective clock signal input terminals of the shift register unit in each stage through the respective clock signal lines;

wherein widths of first level pulses in the clock signals applied to the first clock signal input terminal, the second clock signal input terminal, the third clock signal input terminal, and the fourth clock signal input terminal of the respective shift register units, all are a half of a width of the start pulse signal, and their duty cycles all are $\frac{1}{2}$; and the clock signal applied to the first clock signal input terminal and the clock signal applied to the fourth clock signal input terminal are in synchronization, and the clock signal applied to the second clock signal input terminal and the clock signal applied to the third clock signal input terminal are in synchronization;

a level of the start pulse signal is a first level, a start time of the start pulse signal coincides with a start time of one first level pulse in the clock signals applied to the second clock signal input terminal and the third clock signal input terminal; and a second level pulse in the clock signal applied to the fifth clock signal input terminal, a second level pulse in the clock signal applied to the sixth clock signal input terminal, a first level pulse in the clock signal applied to the seventh clock signal input terminal, and a first level pulse in the clock signal applied to the eighth clock signal input terminal are arranged head-to-end in sequence, their widths all are a quarter of a width of the start pulse signal; a start time of the start pulse signal of the second level pulse in the clock signal applied to the fifth clock signal input terminal coincides with a start time of one first level pulse in the clock signals applied to the first clock signal input terminal and the second clock signal input terminal.

In a seventh aspect, an embodiment of the present disclosure provides a display device, comprising any of the gate driving circuit described above.

The shift register unit provided in the embodiments of the present disclosure can make the layout area occupied by the corresponding gate driving circuit reduce greatly as compared with that occupied by the gate driving circuit in the prior art, which facilitates border narrowing of the corresponding display device.

DETAILED DESCRIPTION OF THE EMBODIMENTS

Hereinafter, specific implementations of the present disclosure will be described in detail with reference to the accompanying drawings and the embodiments, it should be understood that the embodiments provided below are to explain the technical solutions of the present disclosure more clearly, rather than to limit the protection scope of the present disclosure.

Figure 1:
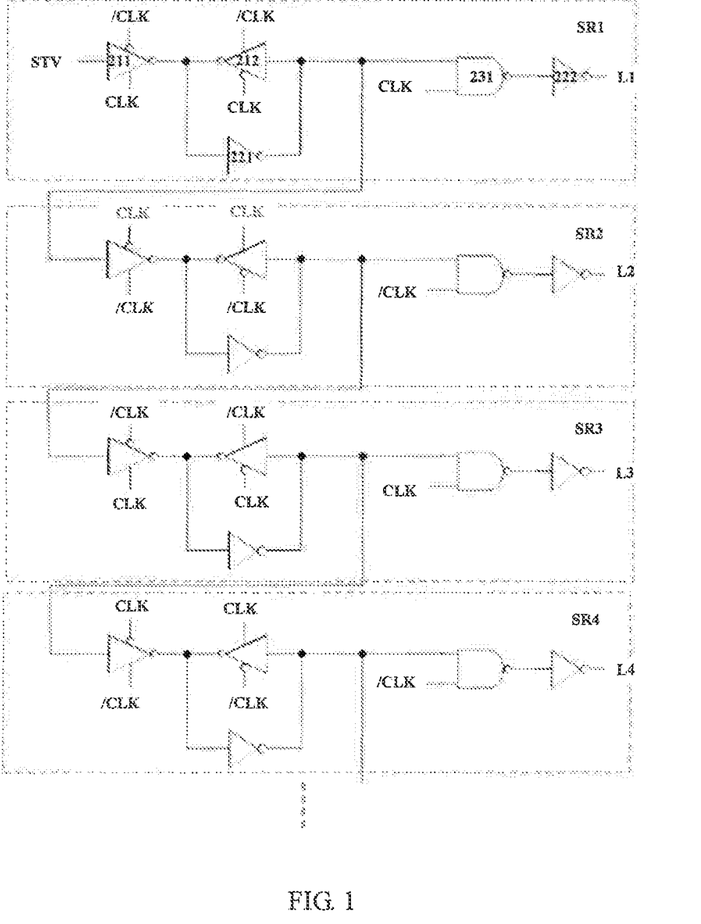
FIG. 1 is a schematic structural diagram of a gate driving circuit.

Referring to FIG. 1, structure of a gate driving circuit may comprise shift register units R1 to SR4 cascaded in respective stages, and the shift register unit in each stage, for example, the shift register unit SR1 in the first stage, comprises two transfer gate circuits 211, 212, two inverters 221, 222, and an NAND gate circuit 231 for outputting a scan pulse.

Figure 2:
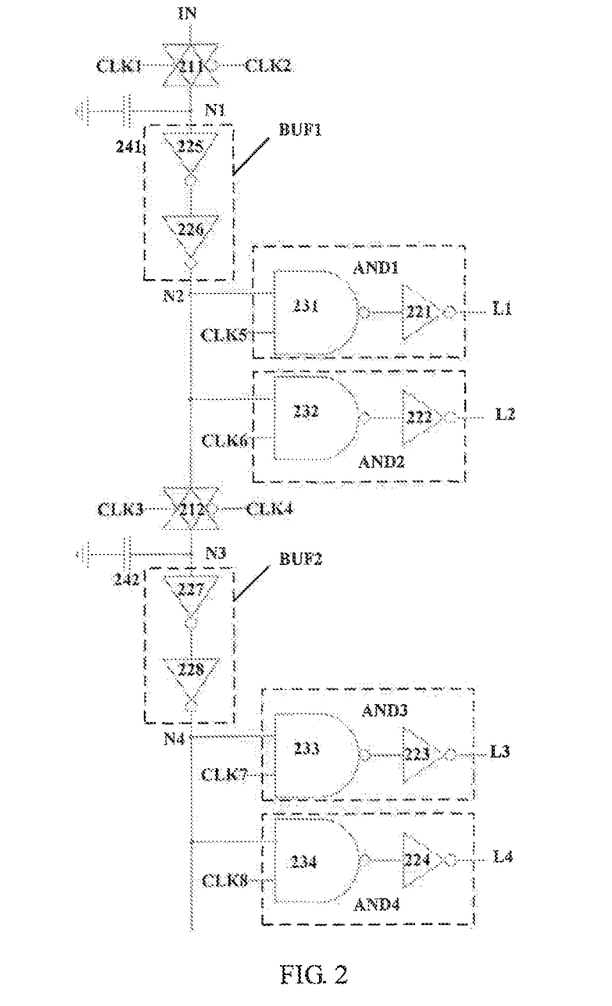
FIG. 2 is a schematic structural diagram of a shift register unit provided by an embodiment of the present disclosure.

Referring to FIG. 2, structure of the shift register unit provided by the embodiment of the present disclosure may comprise:

two transfer gate circuits 211, 212, eight inverter circuits 221, 222, 223, 224, 225, 226, 227, 228, four NAND gate circuits 231, 232, 233, 234, and two capacitors 241, 242, as well as a pulse signal input terminal IN, four pulse signal output terminals L1, L2, L3, L7, and eight clock signal input terminals CLK1, CLK2, CLK3, CLK4, CLK5, CLK6, CLK7, CLK8;

a first terminal of a first capacitor 241 is connected to a first node N1, and a second terminal of the first capacitor 241 is grounded; a first terminal of a second capacitor 242 is connected to a second node N2, and a second terminal of the second capacitor 242 is grounded;

wherein each transfer gate circuit constitutes a transfer gate module configured to be turned on when a first level is inputted to a second input terminal thereof and a third input terminal thereof is at a second level, so as to write a scan signal inputted to a first input terminal thereof to a node connected to an output terminal thereof; here, a level of the scan signal is a first level, the second level being opposite to the first level;

a first input terminal of a first transfer gate circuit 211 is connected to the pulse signal input terminal IN, a second input terminal of the first transfer gate circuit 211 is connected to a first clock signal input terminal CLK1, a third input terminal of the first transfer gate circuit 211 is connected to a second clock signal input terminal CLK2, and an output terminal of the first transfer gate circuit 211 is connected to the first node N1; a first input terminal of a second transfer gate circuit 212 is connected to the second node N2, a second input terminal of the second transfer gate circuit 212 is connected to a third clock signal input terminal CLK3, a third input terminal of the second transfer gate circuit 212 is connected to a fourth clock signal input terminal CLK4, and an output terminal of the second transfer gate circuit 212 is connected to a third node N3; and each NAND gate circuit and one inverter circuit constitute an AND gate module, each AND gate module is configured to output a first level through an output terminal thereof when both a first input terminal thereof and a second input terminal thereof are at a first level.

Referring to FIG. 2, a first NAND gate circuit 231 and a first inverter circuit 221 constitute a first AND gate module AND1, a second NAND gate circuit 232 and a second inverter circuit 222 constitute a second AND gate module AND2, a third NAND gate circuit 233 and a third inverter circuit 223 constitute a third AND gate module AND3, and a fourth NAND gate circuit 234 and a fourth inverter circuit 224 constitute a fourth AND gate module AND4. In each AND gate module, one input terminal of the NAND gate circuit is correspondingly connected to the first input terminal of the AND gate module, the other input terminal of the NAND gate circuit is correspondingly connected to the second input terminal of the AND gate module, the output terminal of the NAND gate circuit is connected to the input terminal of the inverter circuit, and the output terminal of the inverter circuit is connected to the output terminal of the AND gate module. Since the NAND gate circuit can carry out an AND operation on the first level pulse inputted to the two input terminals thereof, and then carry out a negation, thus the signal outputted from the NAND gate circuit is a pulse signal with a second level, which is converted into a pulse signal with a first level after passing through the inverter circuit.

The two inverter circuits 225, 226 connected between the first node N1 and the second node N2 constitute a buffer-amplifier module BUF1, which is referred to as a first buffer-amplifier module for convenience of description; the two inverter circuits 227, 228 connected between the third node N3 and the fourth node N4 constitute a buffer-amplifier module BUF2, which is referred to as a second buffer-amplifier module for convenience of description. Each buffer-amplifier can amplify a pulse signal inputted to its input terminal and thereafter outputting it through its output terminal. For example, in the first buffer-amplifier module BUF1, the output terminal of the inverter circuit 225 is connected to the input terminal of the inverter circuit 226, the input terminal of the inverter circuit 225 serves as the input terminal of this buffer-amplifier module BUF1, and the output terminal of the inverter circuit 226 serves as the output terminal of this buffer-amplifier module BUF1; in the second buffer-amplifier module BUF2, the output terminal of the inverter circuit 227 is connected to the input terminal of the inverter circuit 228, the input terminal of the inverter circuit 227 serves as the input terminal of this buffer-amplifier module BUF2, and the output terminal of the inverter circuit 228 serves as the output terminal of this buffer-amplifier module BUF2. It is not difficult to understand that, the "buffer-amplify" here refers to amplifying a signal current to enhance a signal carrying capacity.

Figure 3:
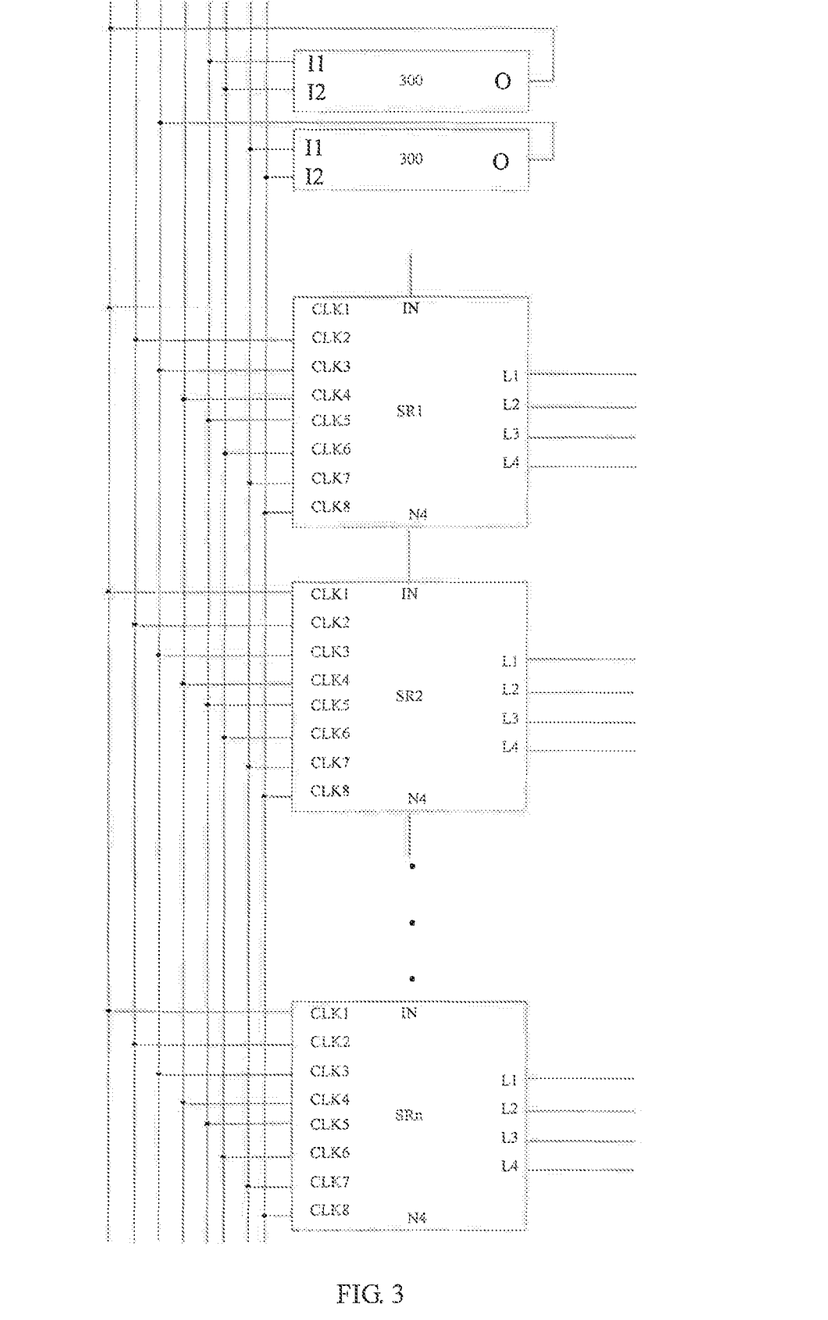
FIG. 3 is a schematic structural diagram of a gate driving circuit including the shift register unit in FIG. 2.

Reference may be made to FIG. 3 for structure of the gate driving circuit including the shift register unit in the embodiment of the present disclosure, the gate driving method comprises a plurality of shift register units SR1 to SRn and a plurality of clock signal lines; each shift register unit is the shift register unit described in the above embodiment;

except the shift register unit, the fourth node N4 of the shift register unit Sri in each stage SRn in a last stage is connected to the pulse signal input terminal IN of the shift register unit Sri+1 in a next stage, and except the shift register unit, the pulse signal input terminal IN of the shift register unit SRi in each stage SR1 in a first stage is connected to the fourth node N4 of the shift register unit in a previous stage SRj−1; within the shift register unit SRi in each stage, each clock signal input terminal is connected to one clock signal line.

In addition, also referring to FIG. 3, the gate driving circuit described above further comprises two OR gate units 300. One input terminal I1 of a first OR gate unit 300 is connected to a clock signal line connected to the fifth clock signal input terminal CLK5 in each shift register unit, the other input terminal I2 of the first OR gate unit 300 is connected to a clock signal line connected to the sixth clock signal input terminal CLK6 in each shift register unit, and an output terminal of the first OR gate unit 300 is connected to a clock signal line connected to the first clock signal input terminal CLK1 in each shift register unit;

one input terminal I1 of a second OR gate unit 300 is connected to a clock signal line connected to the seventh clock signal input terminal CLK7 in each shift register unit, the other input terminal I2 of the second OR gate unit 300 is connected to a clock signal line connected to the eighth clock signal input terminal CLK8 in each shift register unit, and an output terminal of the second OR gate unit 300 is connected to a clock signal line connected to the third clock signal input terminal CLK3 in each shift register unit;

each OR gate unit is configured to output a first level through its output terminal when either one of its two input terminals is inputted with a first level.

Figure 4:
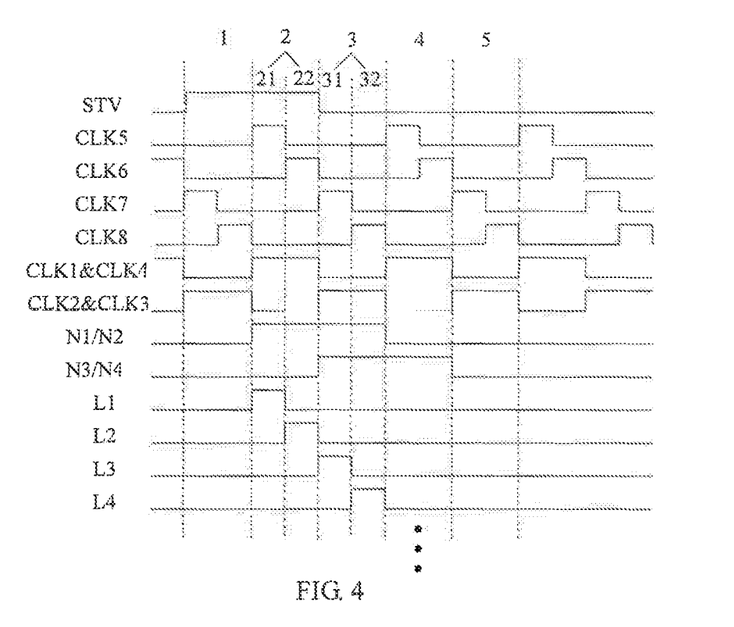
FIG. 4 is a timing diagram of key signals and nodes in a method of driving the gate driving circuit in FIG. 3.

Referring to FIG. 4, a driving method for the gate driving method provided by the embodiment of the present disclosure may, for example, comprise the following flows:

a start pulse signal STV (for convenience of indication, it is assumed that here the first level is a high level and the second level is low level) is inputted to the pulse signal input terminal IN of the shift register unit in a first stage, and corresponding clock signals are applied to the respective clock signal input terminals of the shift register unit in each stage through the respective clock signal lines;

wherein widths of first level pulses in the clock signals applied to the first clock signal input terminal CLK1, the second clock signal input terminal CLK2, the third clock signal input terminal CLK3, and the fourth clock signal input terminal CLK4 of the respective shift register units, all are a half of a width of the start pulse signal STV, and their duty cycles all are ½; and the clock signal applied to the first clock signal input terminal CLK1 and the clock signal applied to the fourth clock signal input terminal CLK4 are in synchronization, and the clock signal applied to the second clock signal input terminal CLK2 and the clock signal applied to the third clock signal input terminal CLK3 are in synchronization.

Here, the level of the start pulse signal STV is a high level, the start time of the start pulse signal STV coincides with a start time of one high level pulse in the clock signals applied to the second clock signal input terminal CLK2 and the third clock signal input terminal CLK3.

The high level pulses, which are in the clock signals applied to the fifth clock signal input terminal CLK5, the sixth clock signal input terminal CLK6, the seventh clock signal input terminal CLK7, and the eighth clock signal input terminal CLK8 of the respective shift register units, are arranged head-to-end in sequence, their widths all are a quarter of a width of the start pulse signal STV; a start time of the high level pulse in the clock signal applied to the fifth clock signal input terminal CLK5 coincides with a start time of one first level pulse in the clock signals applied to the first clock signal input terminal CLK1 and the second clock signal input terminal CLK2.

Next, operation principles of that the gate driving circuit in FIG. 2 adopts the driving method in FIG. 4 to perform driving will be illustrated with reference to FIG. 4.

The following is provided regarding the shift register unit SR1 in the first stage.

In a first period 1, when the level applied to the first clock signal input terminal CLK1 is a low level and the level applied to the second clock signal input terminal CLK2 is a high level, the transfer gate 211 is turned off at this time, although the start pulse signal is inputted to the pulse signal input terminal IN (i.e., being at a high level), the first node N1 cannot be set to a high level, correspondingly, the second node N2 cannot be set to a high level either; thus, neither the first AND gate module AND1 nor the second AND gate module AND2 can output a high level, i.e., neither of the pulse signal output terminals L1 and L2 can output a pulse signal. In addition, although the second transfer gate circuit 212 is enabled to be turned on because the clock signal applied to the third clock signal input terminal CLK3 is at a high level and the clock signal applied to the fourth clock signal input terminal CLK4 is at a low level, since the second node N2 is at a low level, thus the third node N3 is also at a low level, correspondingly, the fourth node N4 is also at a low level, in this case, the third AND gate AND3 and the fourth AND gate AND4 cannot output a high level either, neither of the pulse signal output terminals L3 and L4 outputs a high level.

A second period 2 may be divided into two sub-periods 21 and 22, and in the entire second period 2, since the level applied to the first clock signal input terminal CLK1 is a high level, the level applied to the second clock signal input terminal CLK2 is a low level, and the transfer gate circuit 211 is turned on, thus the start pulse signal inputted to the pulse signal input terminal IN is written to the first node N1, and since the start pulse signal is at a high level, thus the first node N1 is set to a high level, correspondingly, the second node N2 is also at a high level. Since the clock signal applied to the third clock signal input terminal CLK3 is at a low level, the high level of the second node N2 cannot be transferred to the third node N3 at this time, thus the third node N3 is at a low level, correspondingly, the fourth node N4 is also at a low level, in this case, neither of the third AND gate module AND3 and the fourth AND gate module AND4 can output a high level, neither of the pulse signal output terminals L3 and L4 outputs a high level;

In a first sub-period 21, since the level of the second node N2 is a high level, and the clock signal applied to the fifth clock signal input terminal CLK5 is also a high level at this time, thus, in this case, the first AND gate module AND1 outputs a high level through the first scan signal output terminal L1; and since the clock signal applied to the sixth clock signal input terminal CLK6 is at a low level, thus the second AND gate module AND2 cannot output a high level at this time, i.e., the scan signal output terminal L2 is at a low level; in a second sub-period 22, the clock signal applied to the fifth clock signal input terminal CLK5 is at a low level, in this case, the first AND gate module cannot output a high level, i.e., the signal output terminal L1 is at a low level; and since the sixth clock signal input terminal CLK6 is at a high level in the second sub-period 22, the second AND gate module AND2 outputs a high level through the second scan signal output terminal L2.

A third period 3 includes two sub-periods 31 and 32, and the level applied to the first clock signal input terminal CLK1 is a low level, the level applied to the second clock signal input terminal CLK2 is a high level, and the transfer gate circuit 211 is turned off throughout the entire third period 3, thus the level of the first node N1 is maintained at a high level by the capacitor C1, correspondingly, the second node N2 is also at a high level; the signals inputted to the fifth clock signal input terminal CLK5 and the sixth clock signal input terminal CLK6 are both at a low level, in this case, both the first pulse signal output terminal L1 and the second pulse signal output terminal L2 are at a low level. Meanwhile, since the level applied to the third clock signal input terminal CLK3 is a high level and the level applied to the fourth clock signal input terminal CLK4 is a low level throughout the entire third period, thus the transfer gate circuit 212 is turned on, so that the third node N3 is set to a high level, correspondingly, the fourth node N4 is also at a high level;

In a first sub-period 31, since a level of the second node N2 is a high level, and the clock signal applied to the seventh clock signal input terminal CLK7 is also a high level at this time, thus the third AND gate module AND3 outputs a high level through the third scan signal output terminal L3; since the clock signal applied to the eighth clock signal input terminal CLK8 is at a low level, thus the fourth AND gate module AND4 cannot output a high level at this time, i.e., the scan signal output terminal L4 is at a low level; in a second sub-period 32, the clock signal applied to the seventh clock signal input terminal CLK7 is at a low level, the third AND gate module AND3 cannot output a high level at this time, i.e., the scan signal output terminal L3 is at a low level; and since the sixth clock signal input terminal CLK6 is at a high level in the second sub-period 32, the fourth AND gate module AND4 outputs a high level through the fourth scanning signal output terminal L4.

In a fourth period 4, the level applied to the first clock signal input terminal CLK1 is a high level, and the level applied to the second clock signal input terminal CLK2 is a low level; in this case, the first transfer gate circuit 211 is turned on, the level of the first node N1 is set to the level of the pulse signal input terminal IN, and since inputting of the start pulse signal STV has been completed and the level of the pulse signal input terminal IN is a low level at this time, thus the first node N1 is set to a low level, correspondingly, the second node N2 is also at a low level; neither the first pulse signal output terminal L1 nor the second pulse signal output terminal L2 can output a high level; and after this period and before a next frame, no high level will be inputted to the pulse signal input terminal IN any more, the first node N1 cannot be set to a high level any more, thus neither the first pulse signal output terminal L1 nor the second pulse signal output terminal L2 can output a high level any more; and in the fourth period, since the clock signals applied to the seventh clock signal input terminal CLK7 and the eighth clock signal input terminal CLK8 are both at a low level, thus neither the third pulse signal output terminal L3 nor the fourth pulse signal output terminal L4 will output a high level any more.

In a fifth period 5, the level applied to the third clock signal input terminal CLK3 is a high level and the level applied to the fourth clock signal input terminal CLK4 is a low level; in this case, the second transfer gate circuit 212 is turned on, and a level of the third node N3 is set to the level of the second node N2, i.e., a low level; correspondingly, the fourth node N4 is also set to a low level; the third pulse signal output terminal L3 and the second pulse signal output terminal L2 cannot output a high level any more; and after this period and before a next frame, the first node N1 can not be set to a high level any more, the third pulse signal output terminal L3 and the fourth pulse signal output terminal L4 cannot output a high level any more.

In this way, the shift register unit SR1 in the first stage described above outputs a first high level pulse in the first sub-period 21 of the second period 2, outputs a second high level pulse in the second sub-period 22 of the second period 2, outputs a third high level pulse in the first sub-period 31 of the third period 3, and outputs a fourth high-level pulse in the second sub-period 32 of the third stage 3.

It can be seen that, as for the shift register unit SR2 in the second stage, level states of its respective input terminals in the fourth period 4 correspond to level states of the respective input terminals of the shift register unit SR1 in the first stage in the second period 2, in this way, the shift register unit SR2 in the second stage can also output four pulse signals. And a start time of the first pulse signal outputted by the shift register unit in the second stage coincides with an end time of the fourth pulse signal outputted by the shift register unit in the first stage. With the above manner, each shift register unit will start to output a pulse signal after the shift register unit in a previous stage outputs a last pulse signal, the gate driving circuit described above implements consecutive sequential outputting of a plurality of stages of pulse signals as being driven by the driving method described above.

However, the driving method for the gate driving circuit described above is not limited to the type shown in FIG. 4, and FIG. 5 is a timing diagram of key signals and nodes in another method of driving the gate driving circuit described above, different than the driving method shown in FIG. 4, in this method, the start time of the high level pulse in the clock signal applied to the fifth clock signal input terminal CLK5 coincides with the start time of the high level pulse in one of the clock signals applied to the first clock signal input terminal CLK1 and the fourth clock signal input terminal CLK4.

Figure 5:
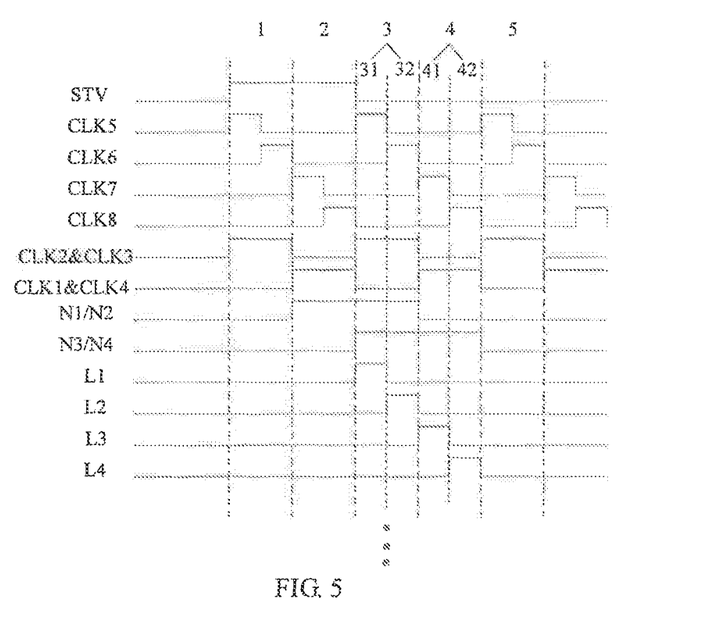
FIG. 5 is a timing diagram of key signals and nodes in another method of driving the gate driving circuit in FIG. 3.

Next, operation principles of that the gate driving circuit in FIG. 2 adopts the driving method in FIG. 5 to perform driving will be illustrated with reference to FIG. 5.

The following is provided regarding the shift register unit SR1 in the first stage.

In a first period 1, since the clock signal applied to the first clock signal input terminal CLK1 is at a low level and the clock signal applied to the second clock signal input terminal CLK2 is at a high level, in this case, the transfer gate circuit 211 is not turned on, both the first node and the second node will not be set to a high level, correspondingly, the third node N3 and the fourth node N4 will not be set to a high level either, thus none of the pulse signal output terminals can output a high level.

In a second period 2, the clock signal applied to the first clock signal input terminal CLK1 is at a high level, the clock signal applied to the second clock signal input terminal CLK2 is at a low level, in this case, the transfer gate circuit 211 is turned on, thus the first node N1 and the second node N2 are both set to a high level; however, since the clock signals applied to the fifth clock signal input terminal CLK5 and the sixth clock signal input terminal CLK6 both are at a low level in this period, thus the first pulse signal output terminal L1 and the second pulse signal output terminal L2 still cannot output a high level; and in this period, since the clock signal applied to the third clock signal input terminal CLK3 is at a low level and the clock signal applied to the fourth clock signal input terminal CLK4 is at a high level, thus the second transfer gate circuit 212 is turned off, the third node N3 and the fourth node N4 will not be set to a high level, in this case, the third pulse signal output terminal L3 and the fourth pulse signal output terminal L4 still will not output a high level.

A third period 3 includes two sub-periods 31 and 32, and the level applied to the first clock signal input terminal CLK1 is a low level, the level applied to the second clock signal input terminal CLK2 is a high Level, and the transfer gate circuit 211 is turned off throughout the entire third period 3, thus the level of the first node N1 is maintained at a high level by the capacitor C1, correspondingly, the second node N2 is also at a high level;

In a first sub-period 31, since the levels at the first node N1 and the second node N2 are high levels, and the clock signal applied to the fifth clock signal input terminal CLK5 at this time also is a high level, thus the clock signal applied to the sixth clock signal input terminal CLK6 is at a low level in this case; since the clock signal applied to the sixth clock signal input terminal CLK6 is at a low level, thus, in this case, the second AND gate module AND2 cannot output a high level, i.e., the second scan signal output terminal L2 is at a low level. In a second sub-period 32, the clock signal applied to the fifth clock signal input terminal CLK5 is a low level, in this case, the first AND gate module AND1 cannot output a high level, i.e., the first scan signal output terminal L1 outputs a low level; and since the clock signal applied to the sixth clock signal input terminal CLK6 in the second sub-period 22 is at a high level, the second AND gate module AND2 outputs a high level through the second scan signal output terminal L2.

Meanwhile, since the level applied to the third clock signal input terminal CLK3 is a high level, the level applied to the fourth clock signal input terminal CLK4 is a low level, and the transfer gate circuit 212 is turned on throughout the entire third period 3, thus the third node N3 is set to a high level, correspondingly, the fourth node N4 also is at a high level; since the clock signals inputted to the seventh clock signal input terminal CLK7 and the eighth clock signal input terminal CLK8 both are at a low level, thus in this case the third pulse signal output terminal L3 and the fourth pulse signal output terminal L4 both are at a low level.

A fourth period 4 includes two sub-periods 41 and 42, since the level applied to the first clock signal input terminal CLK1 is a high level, the level applied to the second clock signal input terminal CLK2 is a low level, and the transfer gate circuit 211 is turned on throughout the entire fourth period 4, and because inputting of the start pulse signal is already completed, in this case, the pulse signal input terminal IN is set to a low level, the first node N1 and the second node N2 are both set to a low level, the first shift register signal output terminal L1 and the second shift signal output terminal L2 both cannot output a high level; and since the first node N1 will not be set to a high level any more after this period and before a next frame, thus the second node N2 will not be a high level any more, the first register signal output terminal L1 and the second register signal output L2 will not output a high level any more.

Throughout the entire fourth period 4, the level applied to the third clock signal input terminal CLK3 is a low level, the level applied to the fourth clock signal input terminal CLK4 is a high level, the transfer gate circuit 212 is turned off, the level of the third node N3 is maintained by the capacitor C2 as a high level;

In a first sub-period 41, since levels of the second node N3 and the fourth node N4 are high levels, and the clock signal applied to the seventh clock signal input terminal CLK7 at this time is a high level, thus in this case, the third AND gate module AND3 outputs a high level through the third scan signal output terminal L3; and since the clock signal applied to the eighth clock signal input terminal CLK8 is at a low level, in this case, the fourth AND gate module AND4 cannot output a high level, i.e., the fourth scan signal output terminal L4 is at a low level. In a second sub-period 42, the clock signal applied to the seventh clocks signal input terminal CLK7 is at a low level, in this case, the third AND gate module AND3 cannot output a high level, i.e., the third scan signal output terminal L3 is at a low level; and since the eighth clock signal input terminal CLK8 is at a high level in the second sub-period 42, thus the fourth AND gate module AND4 outputs a high level through the fourth scan signal output terminal L4.

In a fifth period 5, the clock signal applied to the third clock signal input terminal CLK3 is a high level, the clock signal applied to the fourth clock signal input terminal CLK4 is a low level, the transfer gate circuit 212 is turned on, levels at the third node N3 and the fourth node 4 are set to a low level, thus the third scan signal output terminal L3 and the fourth scan signal output terminal L4 will not output a high level any more; and after the fifth period 5 and before a next frame, the third node N3 and the fourth node N4 will not be set to a high level any more, and the third scan signal output terminal L3 and the fourth scan signal output terminal L4 will not output a high level any more.

Likewise, the shift register unit SR1 in the first stage as described above outputs four consecutive pulse signals in sequence, and as for the shift register unit SR2 in the second stage, it can also output four pulse signals in accordance with the above manner, and the start time of the first pulse signal outputted by the shift register unit SR2 in the second stage is consecutive to the end time of the fourth pulse signal outputted by the shift register unit SR1 in the first stage, in this way, consecutive sequential outputting of a plurality of stages of pulse signals is achieved. The process of outputting the shift pulse by the shift register units in the other stages will be not detailed here.

It can be seen from FIG. 2 that, when the shift register unit provided in the embodiment of the present disclosure is employed in a gate driving circuit, four pulse signals can be outputted only with four NAND gate circuits, eight inverter circuits, two transfer gate circuits, and two capacitors, however, in the prior art, eight transfer gate circuits, eight inverter circuits, and eight NAND gate circuits are required to output four shift pulse signals. Accordingly, the shift register unit provided in the embodiment of the present disclosure can greatly reduce the number of electrical devices required for the corresponding gate driving circuit, and can reduce the layout area of the gate driving circuit.

As can be seen from the above-described driving process, the clock signals applied to the first clock signal output terminal CLK1 and the fourth clock signal output terminal CLK4 of the respective shift register units are in synchronization, and in practice, the first clock signal output terminal CLK1 and the fourth clock signal output terminal CLK4 may be connected to the same clock signal line. The corresponding technical solution can also accomplish the purpose of consecutively, sequentially outputting a plurality of stages of pulse signals, which also should fall within the protection scope of the present disclosure. And in such manner, the use of one clock signal line can be saved and the layout area of the gate driving circuit can be further reduced.

Likewise, the second clock signal output terminal CLK2 and the third clock signal output terminal CLK3 may be also connected to the same clock signal line.

In addition, in the embodiment of the present disclosure, by providing the first buffer-amplifier module between the first node N1 and the second node N2 and providing the second buffer-amplifier module between the third node N3 and the fourth node N4, it is possible to increase load capacity of the second node N2 and the fourth node N4, and better achieve outputting of the pulse signal. However, it can be seen from the above driving process that, the first buffer-amplifier module and the second buffer-amplifier module are necessarily required in a specific implementation. The corresponding technical solution can also realize outputting of the pulse signal, and should fall within the protection scope of the present disclosure.

In an embodiment of the present disclosure, one buffer-amplifier module is implemented by two inverters, but, in practice, four, six or the other even-number of inverter circuits may also be cascaded to achieve one buffer-amplifier module, the respective inverter circuits contained therein are connected head (input terminal)-to-end (output terminal), and the input terminal of the first inverter circuit is connected to the input terminal of the buffer-amplifier module, and the output terminal of the first inverter circuit is connected to the output terminal of the buffer-amplifier module, or the buffer-amplifier module may also be implemented through structures other than the inverter circuit. On the basis of being capable of achieving the buffering-amplifying function, how the buffer-amplifier module is designed will not affect implementation of the present disclosure, and the corresponding technical solutions should fall within the protection scope of the present disclosure. Likewise, the AND gate module may also be implemented in other structures.

As for the specific structure of the inverter circuit herein, reference may be made to the prior art. In addition to the input and output terminals described above, the inverter circuit generally further includes an input terminal for an inverted DC voltage, so that its output terminal can output an inverted voltage. Since the inverter circuit has a stable DC voltage input, it can provide better load capacity to achieve the buffering-amplifying function on the input signal.

In the gate driving circuit of FIG. 3, by providing two OR gate units, the clock signal applied to the fifth clock signal input terminal CLK5 of each shift register unit and the clock signal applied to sixth clock signal input terminal CLK6 of each shift register unit can be combined to obtain the clock signal applied to the first clock signal input terminal CLK1, and likewise, the clock signal applied to the seventh clock signal input terminal CLK7 of each shift register units and the clock signal applied to the eighth clock signal input terminal CLK8 of each shift register unit can combined to obtain the clock signal applied to the first clock signal input terminal CLK1, so that it is possible to reduce the number of clock signals that need to be inputted to the gate driving circuit, and reduce the difficulty in manufacturing the driving circuit for driving the gate driving circuit. Of course, in practice, driving for this gate driving circuit can be realized without providing the first OR gate unit and/or the second OR gate unit, and the corresponding technical solution should fall within the protection of the present disclosure.

Figure 6:
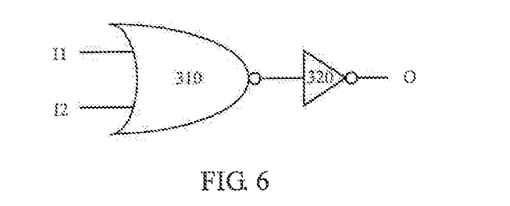
FIG. 6 is a schematic structural diagram of an OR gate unit 300.

In practice, referring to FIG. 6, each OR gate unit 300 may include one NOR gate circuit 310 and one inverter circuit 320, wherein an input terminal of the NOR gate circuit is connected to the first input terminal I1 of the OR gate unit 300, the other input terminal of the NOR gate circuit is connected to the second input terminal I2 of the OR gate unit 300, and an output terminal of the NOR gate circuit is connected to the input terminal of the OR gate unit 300. The output terminal of the OR gate unit 300 is connected to the output terminal of the OR gate unit 300.

Meanwhile, in the above embodiment, the second terminals of the capacitor C1 and the capacitor C2 are connected to a ground terminal, so that voltages at the second terminals of the capacitor C1 and the capacitor C2 are kept stable to avoid affecting the level states of the first node N1 and the third node N3.

Figure 7:
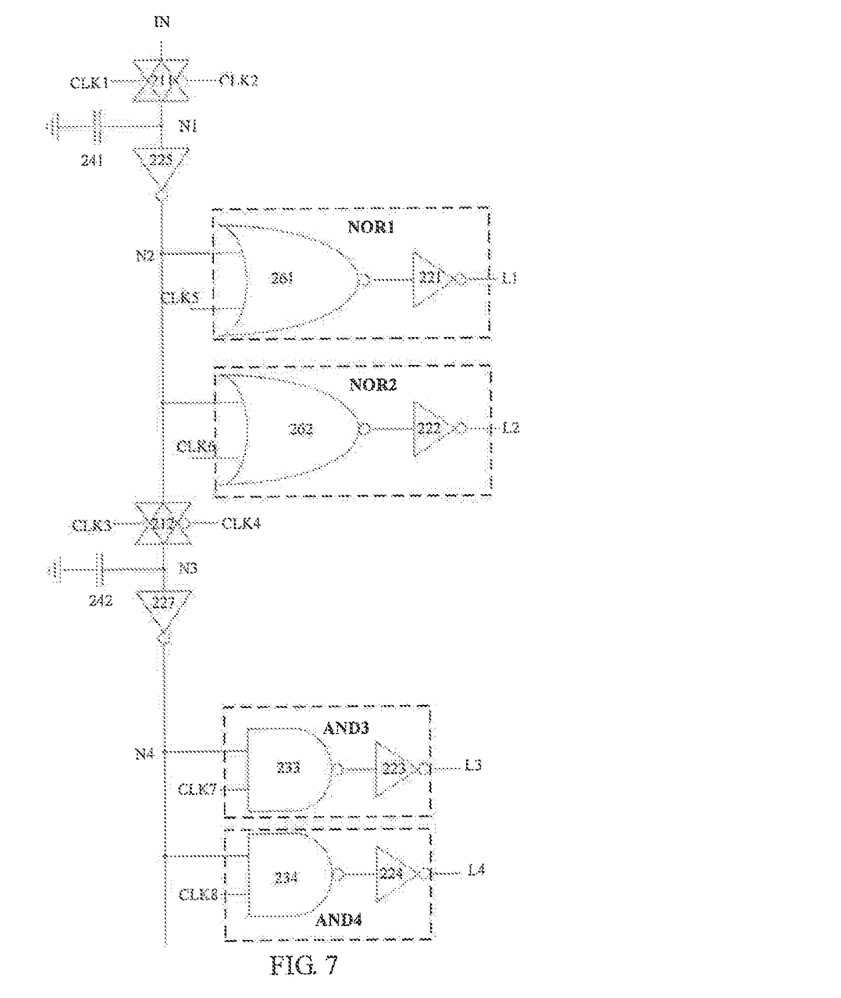
FIG. 7 is a schematic structural diagram of a shift register unit according to another embodiment of the present disclosure.

Reference may be made to FIG. 7 for structure of the shift register unit provided by another embodiment of the present disclosure, different than the shift register unit in FIG. 2, only one inverter circuit 225 is connected between the first node N1 and the second node N2, and only one inverter circuit 227 is connected between the third node N3 and the fourth node N4 in FIG. 7. At the same time, the first NAND gate circuit 231 in FIG. 2 is replaced with an OR circuit 261, the OR circuit 261 and the inverter circuit 221 constitute a first NOR gate NOR1; and the second NAND gate circuit 232 in FIG. 2 is replaced with an OR circuit 262, the OR gate circuit 262 and the inverter circuit 222 constitute a second NOR gate NOR2.

It is not difficult to understand that, here, it is equivalent to that the second node N2 is set to an inverted level, i.e., a low level, by the inverter circuit 225 when the first node N1 is at a high level. In this way, when the second node N2 is at a low level, and the fifth clock signal input terminal CLK5 is at a low level, the first NOR circuit is capable of outputting a first pulse signal having a high level; when the sixth clock signal input terminal CLK6 is at a low level, the second NOR gate circuit is capable of outputting a second pulse signal having a high level.

It is not difficult to understand that, in the shift register unit shown in FIG. 7, the one inverter circuit connected between the first node N1 and the second node N2 functions as an inverting module to implement the inverting function, and at the same time, the inverter circuit is capable of achieving the buffer-amplifying function, it enhances the load capacity of the second node N2. Of course, in practice, the inverter module does not necessarily need to be realized by an inverter circuit if the inverting function is only concerned. In addition, in practice, the inverter module may also comprise three, five or other odd-number of inverter circuits cascaded, wherein the inverter circuit in a first stage is connected to the first node N1, the inverter circuit in a last stage is connected to the second node N2, and the inverter circuit in the other stages are connected head (input terminal) to end (output terminal). Likewise, the inverter module connected between the third node N3 and the fourth node N4 may employ a plurality of inverter circuits or may be replaced with other circuits capable of realizing the inverting function. The corresponding technical solutions should fall within the scope of the present disclosure.

Figure 8:
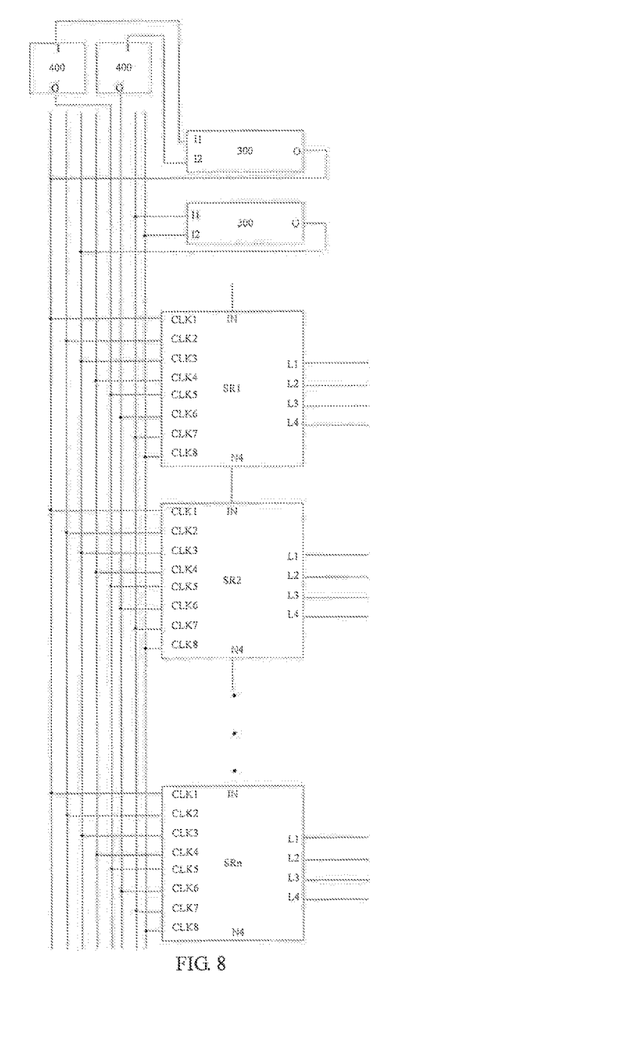
FIG. 8 is a schematic structural diagram of a gate driving circuit including the shift register unit in FIG. 7.

Reference may be made to FIG. 8 for the schematic diagram of the gate driving circuit including the shift register in FIG. 7. What is different than FIG. 3 is that, two inverter units 400 are also comprised in this gate driving circuit, and two input terminals of the first OR gate unit 300 are not directly connected to a clock signal line to which the fifth clock signal input terminal and the sixth clock signal input terminal of each shift register unit are connected. The input terminal I of the first inverter unit 400 is connected to one input terminal I of the first OR gate unit 300, an output terminal O of the first inverter unit 400 is connected to the clock signal line to which the fifth clock signal input terminal of each register unit is connected. An input terminal I of the second inverter unit 400 is connected to the other input terminal I2 of the first OR gate unit 300, an output terminal O of the second inverter 400 is connected to the clock signal line to which the sixth clock signal input terminal CLK6 of each shift register unit is connected. An output terminal O of the first OR gate unit 300 is connected to the clock signal line to which the first clock signal input terminal CLK1 of each shift register unit is connected. The connection relationship of the second OR gate unit 300 may be the same as that shown in FIG. 3, and details will not be repeated here.

In practice, herein, the inverting unit 400 may be composed by one inverter circuit, or may also be composed by an odd number, which is more than one, of inverter circuits cascaded.

Figure 9:
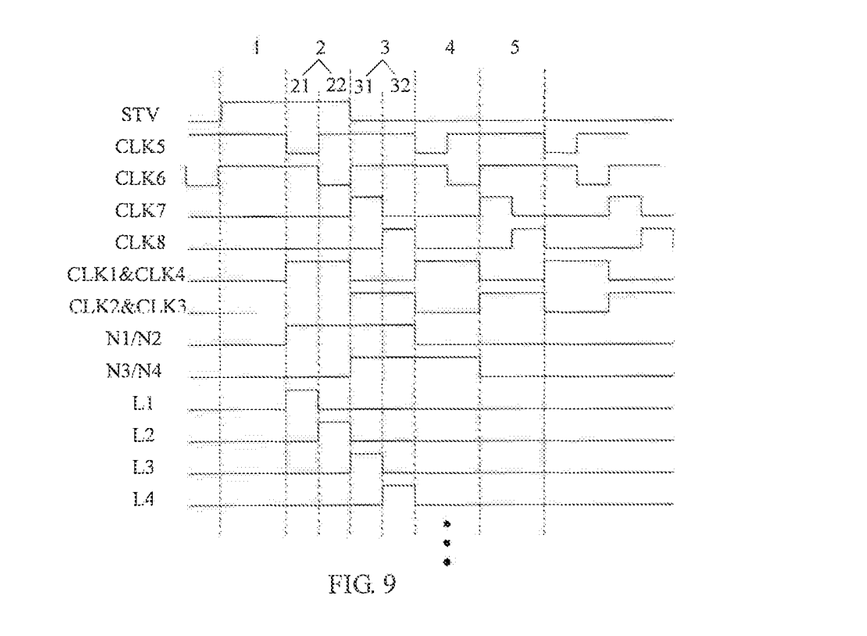
FIG. 9 is a timing diagram of key signals and nodes in a method of driving the gate driving circuit in FIG. 8.

Reference may be made to FIG. 9 for the driving method for the gate driving circuit described above. What is different than FIG. 4 is that, the clock signal applied to the clock signal input terminal CLK5 in FIG. 8 is phase-opposite to the clock signal applied to the clock signal input terminal CLK5 in FIG. 4; likewise, the clock signal applied to the clock signal input terminal CLK6 in FIG. 9 is phase-opposite to the clock signal applied to the clock signal input terminal CLK6 in FIG. 4.

Figure 10:
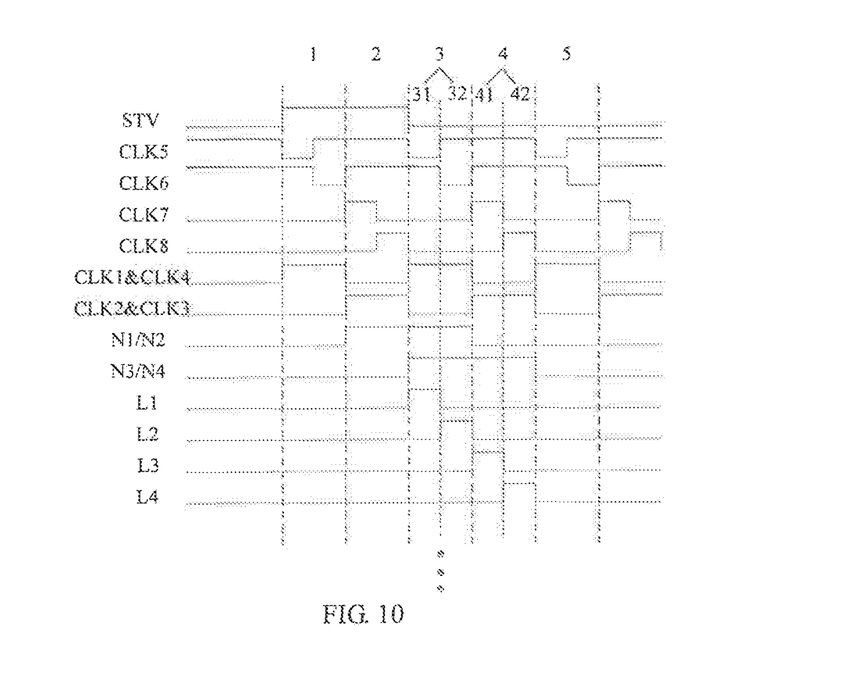
FIG. 10 is a timing diagram of key signals and nodes in another method of driving the gate driving circuit FIG. 8.

Reference may be made to FIG. 10 for another driving method for the gate driving method described above, what is different than FIG. 5 is that, the clock signal applied to the clock signal input terminal CLK5 in FIG. 10 is phase-opposite to the clock signal applied to the clock signal input terminal CLK5 in FIG. 5; likewise, the clock signal applied to the clock signal input terminal CLK6 in FIG. 10 is phase-opposite to the clock signal applied to the clock signal input terminal CLK6 in FIG. 5.

It is not difficult to understand that, the two inverter units 400 and the two OR gates 300 are not necessarily required in practice, in this case, corresponding clock signals can be supplied to the respective clock signal input terminals to drive the gate drive circuit described above.

As another aspect of the present disclosure, an embodiment of the present disclosure also provides a display device including the gate driving circuit described above.

Here, the display device may be display panel, electronic paper, mobile phone, tablet computer, television, laptop, digital photo frame, navigation systems and any other products or components having a display function.

It is not difficult to understand that, the display device provided by the embodiment of the present disclosure may be a liquid crystal display device, and may also be other types of display device.

The foregoing is merely preferred embodiments of the present disclosure, it should be noted that various improvements and modifications can be made by those skilled in the art without departing from the principles of the present disclosure, and these improvements and modifications should also be considered as falling into the protection scope of the present disclosure.

The present disclosure claims priority of the Chinese Patent Application No. 201510745607.7 filed on Nov. 5, 2015, the entire disclosure of which is hereby incorporated in full text by reference as part of the present application.

What is claimed is:

1. A shift register unit, comprising two transfer gate modules, two NOR gate modules, two AND gate modules, two capacitor modules, and two inverter modules;
    a first terminal of a first capacitor module is connected to a first node; a first terminal of a second capacitor module is connected to a third node;
    a first input terminal of a first transfer gate module is connected to the pulse signal input terminal, a second input terminal of the first transfer gate module is connected to a first clock signal input terminal, a third input terminal of the first transfer gate module is connected to a second clock signal input terminal, and an output terminal of the first transfer gate module is connected to the first node; a first input terminal of a second transfer gate module is connected to a second node, a second input terminal of the second transfer gate module is connected to a third clock signal input terminal, a third input terminal of the second transfer gate module is connected to a fourth clock signal input terminal, and an output terminal of the second transfer gate module is connected to the third node;
    each transfer gate module is configured to be turned on when the first level is inputted to the second input terminal thereof and the third input terminal thereof is at a second level, so as to write a scan signal inputted to the first input terminal thereof to a node connected to the output terminal thereof; a level of the scan signal is the first level, the second level being opposite to the first level;
    a first input terminal of a first NOR gate module is connected to a fifth clock signal input terminal, a second input terminal of the first NOR gate module is connected to the second node, and an output terminal of the first NOR gate module is connected to a first pulse signal output terminal; a first input terminal of a second NOR gate module is connected a sixth clock signal input terminal, a second input terminal of the second NOR gate module is connected to the second node, and an output terminal of the second NOR gate module is connected to a second pulse signal output terminal; and
    each NOR gate module is configured to output the first level through the output terminal thereof when both the first input terminal thereof and the second input terminal thereof are at a second level; the second level being opposite to the first level;

a first input terminal of a first AND gate module is connected to a seventh clock signal input terminal, a second input terminal of the first AND gate module is connected to a fourth node, and an output terminal of the first AND gate module is connected to a third pulse signal output terminal; a first input terminal of the second AND gate module is connected to an eighth clock signal input terminal, a second input terminal of the second AND gate module is connected to the fourth node, and an output terminal of the second AND gate module is connected to a fourth pulse signal output terminal;

each AND gate module is configured to output the first level through the output terminal thereof when both the first input terminal thereof and the second input terminal thereof are at the first level;

an input terminal of a first inverter module is connected to the first node, an output terminal of the first inverter module is connected to the second node; an input terminal of a second inverter module is connected to the third node, and an output terminal of the second inverter module is connected to the fourth node; and each inverter module is configured to phase-invert a level signal inputted to the input terminal thereof and output it through the output terminal thereof, the shift register unit further comprising a first OR gate unit and/or a second OR gate unit, a first inverter unit and a second inverter unit;

one input terminal of the first OR gate unit is connected to a clock signal line connected to the fifth clock signal input terminal in each shift register unit via the first inverter unit, the other input terminal of the first OR gate unit is connected to a clock signal line connected to the sixth clock signal input terminal in each shift register unit via the second inverter unit, and an output terminal of the first OR gate unit is connected to a clock signal line connected to the first clock signal input terminal in each shift register unit;

one input terminal of the second OR gate unit is connected to a clock signal line connected to the seventh clock signal input terminal in each shift register unit, the other input terminal of the second OR gate unit is connected to a clock signal line connected to the eighth clock signal input terminal in each shift register unit, and an output terminal of the second OR gate unit is connected to a clock signal line connected to the third clock signal input terminal in each shift register unit; and each OR gate unit is configured to output the first level through the output terminal thereof when either one of the two input terminals thereof is inputted with the first level.

2. The shift register unit according to claim 1, wherein each inverter module is configured to phase-invert and buffer-amplify a level signal inputted to the input terminal thereof and output it through the output terminal thereof, wherein each inverter module comprises an odd number of inverter circuits;

when the number of the inverter circuits is one, an input terminal of the inverter circuit is the input terminal of the inverter module, and an output terminal of the inverter circuit is the output terminal of the inverter module; and when the number of the inverter circuits is an odd-number not equal to one, the respective inverter circuits are cascaded to each other, an input terminal of the inverter circuit in a first stage is the input terminal of the inverter module, and an output terminal of the inverter circuit in a last stage is the output terminal of the inverter module.

3. The shift register unit according to claim 1, wherein each NOR gate module comprises one OR circuit and one inverter circuit, one input terminal of the OR gate circuit is a first input terminal of the NOR gate circuit, the other input terminal of the OR gate circuit is a second input terminal of the input terminal of the NOR gate circuit, an output terminal of the OR gate circuit is connected to the input terminal of the inverter circuit; the output terminal of the inverter circuit is the output terminal of the NOR gate circuit; and the OR gate circuit is configured to output the first level through the output terminal thereof when the first level is inputted to either one of the two input terminals.

4. The shift register unit according to claim 3, further comprising a ground voltage terminal, a second terminal of each capacitor module being connected to the ground voltage terminal.

5. The shift register unit according to claim 1, wherein the first clock signal input terminal and the fourth clock signal input terminal are the same clock signal input terminal; the second clock signal input terminal and the third clock signal input terminal are the same clock signal input terminal.

6. A gate driving circuit, comprising: a plurality of shift register units and a plurality of clock signal lines; each shift register unit being a shift register unit according to claim 1;

except the last stage, the fourth node of the shift register unit in each stage is connected to the pulse signal input terminal of the shift register unit in a next stage, and except the first stage, the pulse signal input terminal of the shift register unit in each stage is connected to the fourth node of the shift register unit in a previous stage; within the shift register unit in each stage, each clock signal input terminal is connected to one clock signal line.

7. The gate driving circuit according to claim 1, wherein each OR gate unit comprises one NOR gate circuit and one inverter circuit;

one input terminal of the NOR gate circuit is one input terminal of the OR gate unit, the other input terminal of the NOR gate circuit is the other input terminal of the OR gate unit, and an output terminal of the NOR gate circuit is connected to an input terminal of the inverter circuit; and an output terminal of the inverter circuit is the output terminal of the OR gate unit.

8. A method of driving a gate driving circuit according to claim 6, the method comprising:

inputting a start pulse signal to the pulse signal input terminal of the shift register unit in a first stage, and applying corresponding clock signals to the respective clock signal input terminals of the shift register unit in each stage through the respective clock signal lines;

wherein widths of first level pulses in the clock signals applied to the first clock signal input terminal, the second clock signal input terminal, the third clock signal input terminal, and the fourth clock signal input terminal of the respective shift register units all are a half of a width of the start pulse signal, and their duty cycles all are ½; and the clock signal applied to the first clock signal input terminal and the clock signal applied to the fourth clock signal input terminal are in synchronization, and the clock signal applied to the second clock signal input terminal and the clock signal applied to the third clock signal input terminal are in synchronization;

a level of the start pulse signal is a first level, a start time of the start pulse signal coincides with a start time of one first level pulse in the clock signals applied to the second clock signal input terminal and the third clock signal input terminal; and a second level pulse in the clock signal applied to the fifth clock signal input terminal, the second level pulse in the clock signal applied to the sixth clock signal input terminal, the first level pulse in the clock signal applied to the seventh clock signal input terminal, and the first level pulse in the clock signal applied to the eighth clock signal input terminal are arranged head-to-end in sequence, their widths all are a quarter of a width of the start pulse signal; a start time of the start pulse signal of the second level pulse in the clock signal applied to the fifth clock signal input terminal coincides with a start time of one first level pulse in the clock signals applied to the first clock signal input terminal or the second clock signal input terminal.

* * * * *